United States Patent [19]

Ushijima

[11] Patent Number: 5,393,624
[45] Date of Patent: Feb. 28, 1995

[54] METHOD AND APPARATUS FOR MANUFACTURING A SEMICONDUCTOR DEVICE

[75] Inventor: Mitsuru Ushijima, Tama, Japan

[73] Assignee: Tokyo Electron Limited, Tokyo, Japan

[21] Appl. No.: 921,598

[22] Filed: Aug. 3, 1992

Related U.S. Application Data

[63] Continuation-in-part of Ser. No. 386,201, Jul. 28, 1989, abandoned.

[30] Foreign Application Priority Data

| Jul. 29, 1988 | [JP] | Japan | 63-190393 |
| Jul. 29, 1988 | [JP] | Japan | 63-190394 |
| Jul. 30, 1988 | [JP] | Japan | 63-191713 |

[51] Int. Cl.$^6$ .............. G03C 5/00; H01L 21/306; G01B 11/02; G01N 21/00
[52] U.S. Cl. ............. 430/30; 430/311; 156/626; 356/355; 356/357; 356/381; 356/444
[58] Field of Search .............. 430/30; 356/381, 444, 356/357, 355; 156/626

[56] References Cited

U.S. PATENT DOCUMENTS

| 3,707,760 | 1/1973 | Citrin | 29/413 |
| 4,121,936 | 10/1978 | Matsuda et al. | 96/35.1 |
| 4,285,433 | 8/1981 | Garrett et al. | 209/573 |
| 4,500,615 | 2/1985 | Iwai | 430/30 |
| 4,738,910 | 4/1988 | Ito et al. | 430/30 |
| 4,778,326 | 10/1988 | Althouse et al. | 414/786 |
| 4,841,156 | 6/1989 | May et al. | 250/458.1 |
| 4,851,311 | 7/1989 | Millis et al. | 430/30 |
| 4,977,330 | 12/1990 | Batcheder et al. | 356/381 |
| 5,220,405 | 6/1993 | Barbee et al. | 356/357 |

FOREIGN PATENT DOCUMENTS

| 0507589A2 | 7/1992 | European Pat. Off. | 430/30 |
| 61293114 | 3/1988 | Japan . | |
| 143816 | 6/1988 | Japan | 430/30 |
| 63-293114 | 6/1988 | Japan | 430/30 |
| 1228130 | 8/1988 | Japan | 430/30 |

OTHER PUBLICATIONS

Elliott, David J. Integrated Circuit Fabrication Technology; McGraw-Hill Book Co., 1982 pp.–21, 112, 113, 145.

Primary Examiner—Marion E. McCamish
Assistant Examiner—Bernard Codd
Attorney, Agent, or Firm—Oblon, Spivak, McClelland, Maier & Neustadt

[57] ABSTRACT

A method of manufacturing a semiconductor device of this invention relates to a method of manufacturing a semiconductor device with ultra-micropattern electrodes. Light is projected on a resist film, and reflected light from a region on which no semiconductor chip is formed, i.e., a flat region is detected to measure the thickness of the resist film. Based on the measured thickness, at least one of the resist film forming step, the exposing step, and the developing step is controlled, so that the electrodes have a desired width.

6 Claims, 9 Drawing Sheets

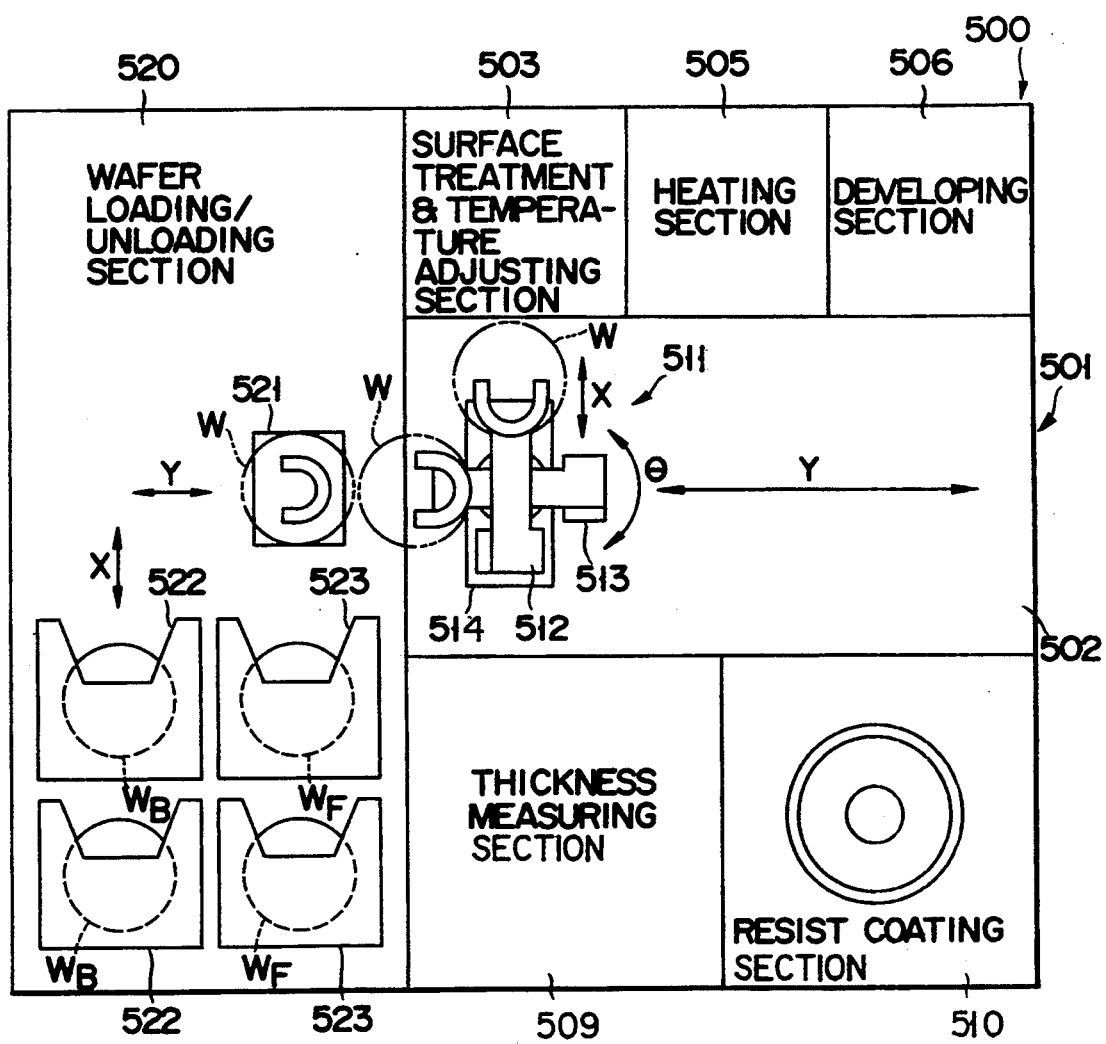
F I G. 1

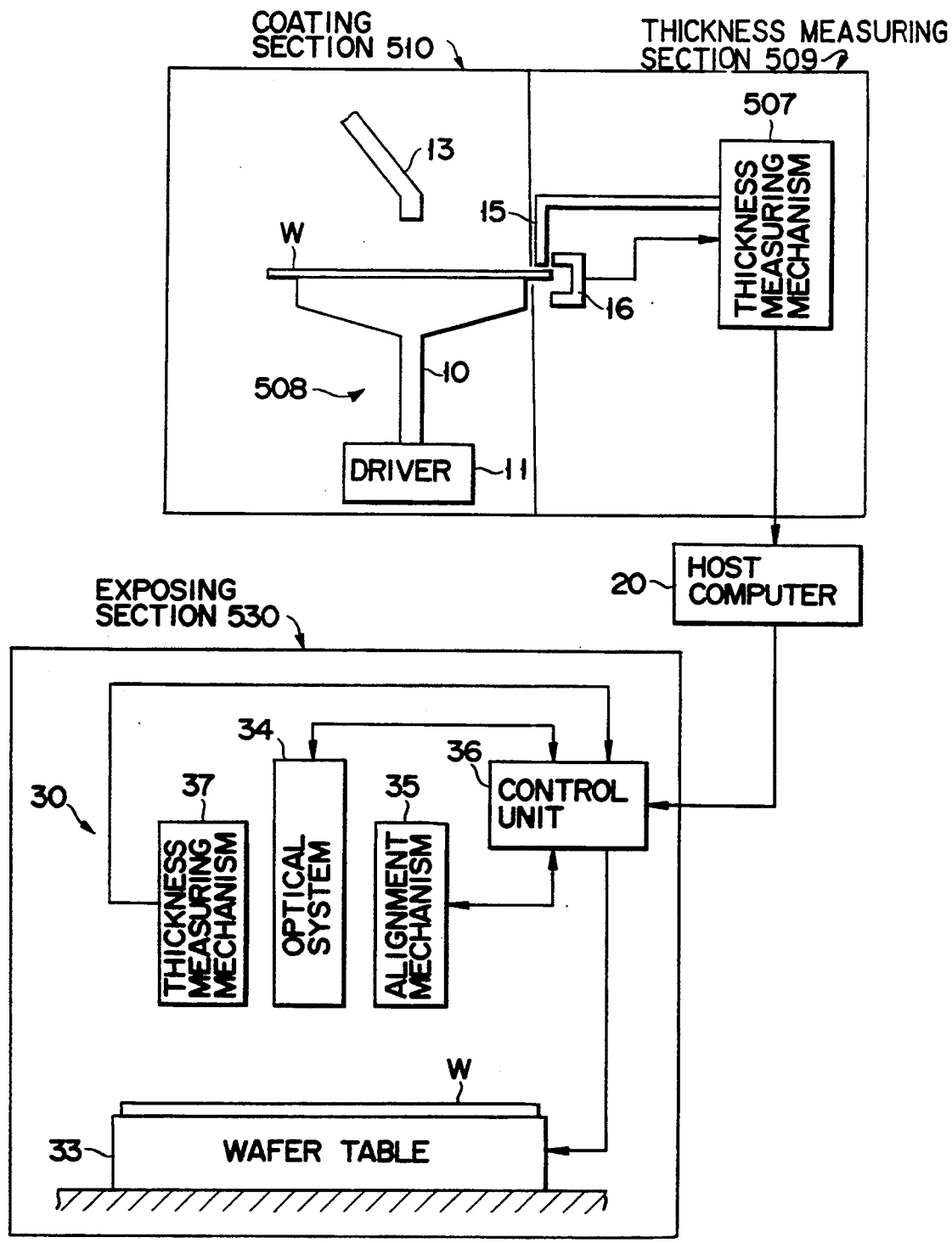
F I G. 4

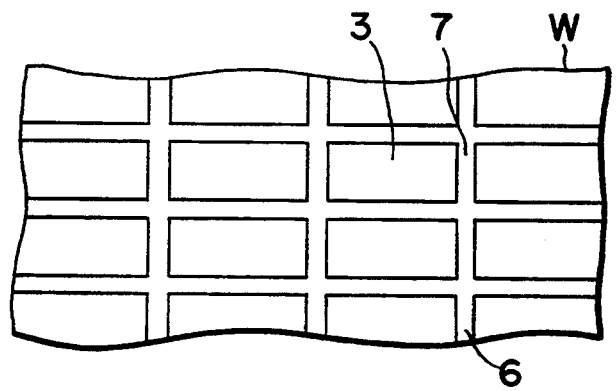
F I G. 5
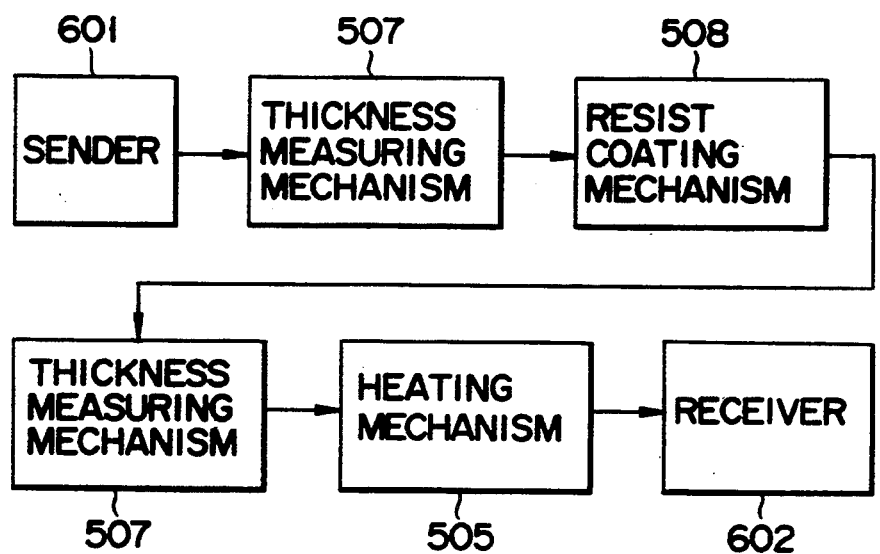
F I G. 8

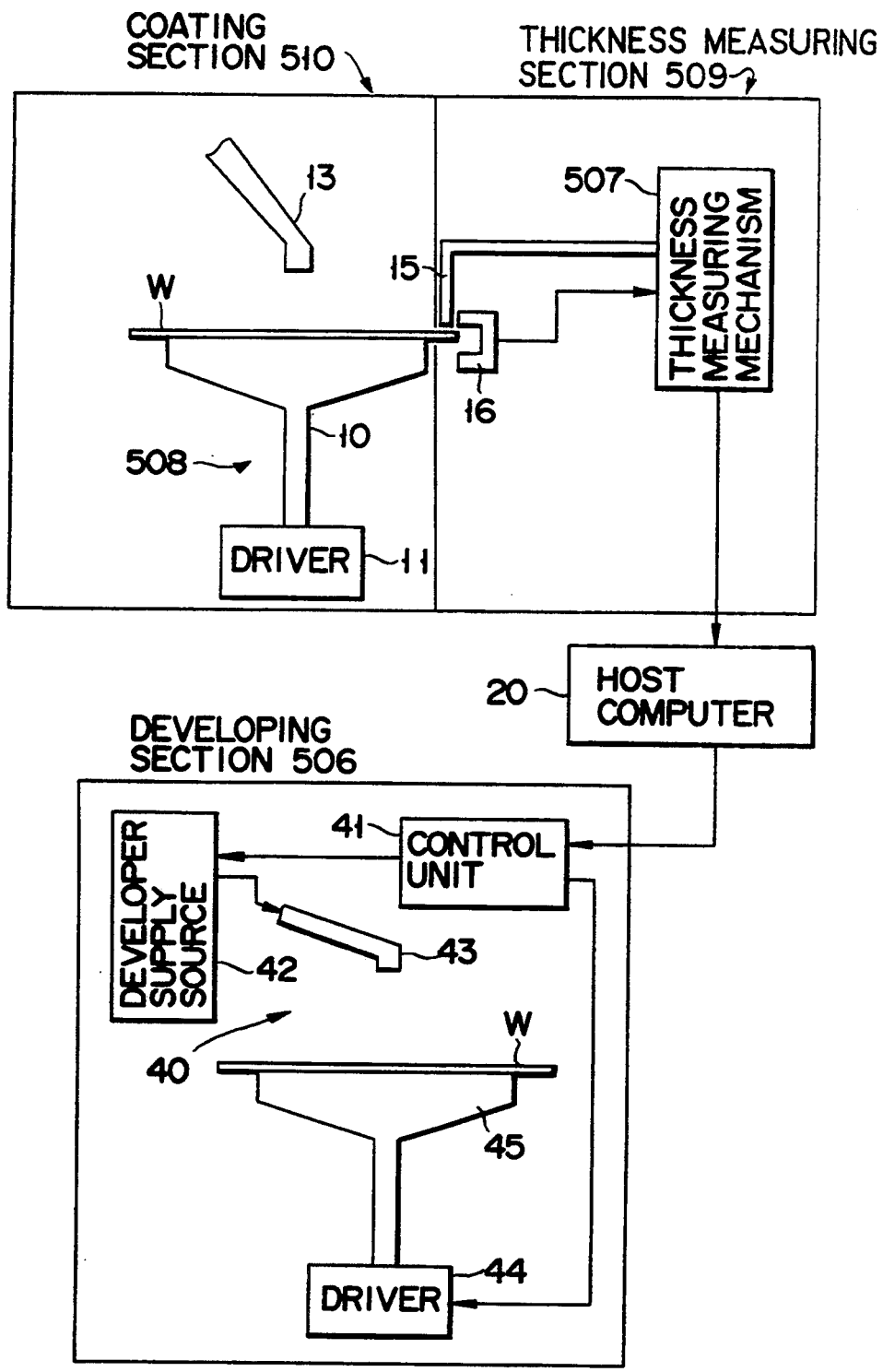
F I G. 6

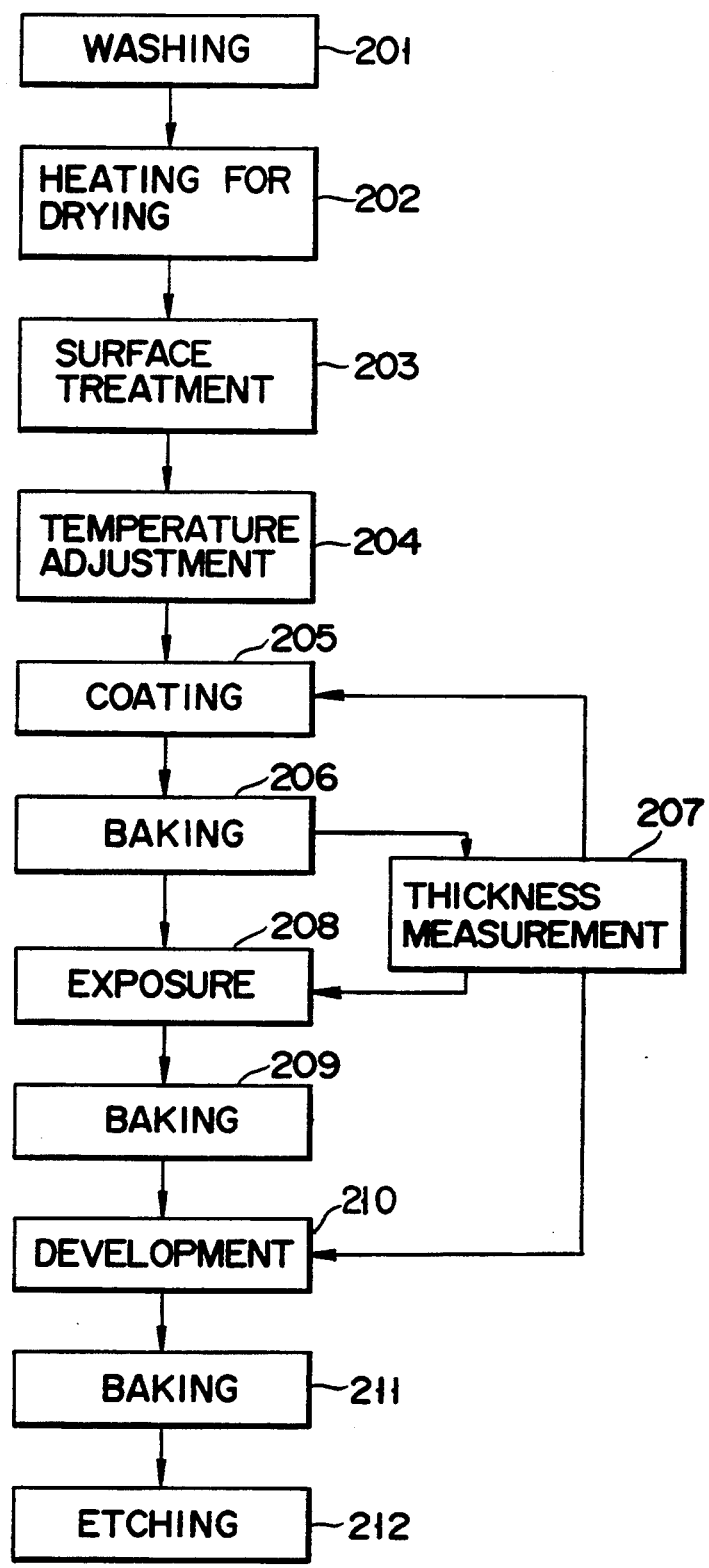
F I G. 7

METHOD AND APPARATUS FOR MANUFACTURING A SEMICONDUCTOR DEVICE

This application is a Continuation-In-Part of application Ser. No. 07/386,201, filed on Jul. 28, 1989, now abandoned.

BACKGROUND OF THE INVENTION

1. Field of the Invention

The present invention relates to a method and an apparatus for manufacturing a semiconductor device and, more particularly, to a method of measuring a film thickness of a resist film coated on a semiconductor wafer.

2. Description of the Related Art

In manufacturing a semiconductor device such as an IC or an LSI, a plurality of photolithography operations are performed on a semiconductor wafer to form a large number of chips having electrodes in a predetermined pattern.

Along with an increase in integration degree of the electrodes on a device, it is required to accurately and uniformly form a resist layer (film) having a predetermined thickness on a semiconductor wafer. In order to satisfy such a requirement, a spin coater which can suppress a variation in thickness of a resist film to fall within a range of 4 to 5 nm has been developed and is commercially available.

When a resist film is formed by a spin coater, the thickness of the resist film varies unless the temperature and humidity of a resist solution, a wafer, and a coating atmosphere are constant. Even in a single wafer, the film thickness tends to be increased at a central portion, and:tends to be decreased at a peripheral portion. If the thickness of the resist film is uneven, a width of an electrode varies, and a micro-pattern cannot be accurately formed by photolithography.

In a conventional system, the thickness of a resist film of a wafer to be a product is not directly measured in a production process, but only the thickness of a dummy wafer (sampling wafer) is measured. However, in a semiconductor device (e.g. super LSI) with an ultra-micropattern, since a variation in thickness of the resist film seriously influences the width of an electrode, 10 the thickness of the resist film coated on a wafer to be a product must be measured in a production process.

In the step of forming a large number of semiconductor chips on a wafer, a plurality of photolithography steps are performed. In these photolithography steps, a wafer undercoating layer is in a flat state often in only a first photolithography step.

In a conventional method of measuring the thickness of a resist film, light of a predetermined wavelength is radiated on a substrate surface, light components reflected by the substrate and resist film surfaces are respectively detected, and a film thickness is calculated and determined on the basis of the detected light components.

However, in the conventional method of measuring the thickness of the resist film, if the undercoating layer of the wafer is not flat, the thickness of the resist film cannot be accurately measured. For this reason, in the photolithography steps, except for the first photolithography step, the resist film thickness cannot be measured on an arbitrarily selected point on a wafer. Especially, in the step of coating a resist solution, since the thickness of the resist film of the wafer varies due to the influence of the environmental temperature and humidity, the thickness of the resist film cannot be accurately determined. Thus, a width of an electrode may vary, and the manufacturing yield of semiconductor devices with ultra-micropatterns is decreased.

SUMMARY OF THE INVENTION

It is an object of the invention to provide a method of manufacturing a semiconductor device, in which the thickness of a resist film coated on a semicondctor wafer can be accurately measured in a manufacturing step in an on-line manner, and the yield of semiconductor devices with ultramicro-patterns can be improved, more specifically to a method in which the thickness of a resist film of a semiconductor device having a multi-layered structure including an underlying layer can be accurately set.

According to an aspect of the present invention, there is provided a method of manufacturing a semiconductor device for controlling a thickness of a resist film formed on a semiconductory wafer, said method comprising the steps of:

measuring a thickness of an underlying layer formed on a wafer;

storing the underlying layer thickness measurement data into memory means;

storing table data (first reference data) of an optimum resist film thickness determined for each underlying layer thickness, table data (second reference data) for providing a resist film thickness corresponding to a wafer rotation number, data (third reference data) for a target resist film thickness, data (fourth reference data) for an allowable resist film thickness range, into the memory means before said underlying layer thickness measuring step;

obtaining a wafer rotation number based on the second reference data and the third reference data;

rotating the wafer at the obtained rotation number so as to apply a resist on the underlying layer;

obtaining a thickness of the resist film applied on the underlying layer, based on sad underlying layer thickness measurement data and said first reference data;

storing the thickness measurement data for the applied resist into the memory means;

detecting a difference between the applied resist thickness measurement data and said third reference data;

calculating a correction value for the wafer rotation number, based on the detected difference and said second reference data;

storing the correction value of the wafer rotation number into the memory means as fifth reference data;

correcting the wafer rotation number during application of the resist to the wafer, based on the fifth reference data, and feedback-controlling the wafer rotation number so that a wafer following the previous one has said target resist thickness.

According to another aspect of the present invention, there is provided a method of manufacturing a semiconductor device for controlling a thickness of a film formed on a semiconductor wafer, said method comprising the steps of;

obtaining contrast table data indicating a correlation between an optimum resist film thickness and a critical dimension of a chip pattern after development;

storing the contrast table data into memory means; measuring a phase difference of a standing wave generated due to interference between an incident light beam and a reflected light beam by irradiating light having an exposure wavelength on an underlying layer;

calculating an optimum thickness of a resist film applied on the basis of the phase difference between the light beams having the exposure wavelength;

obtaining the number of rotation of a wafer based on the optimum resist film thickness calculated;

forming a resist film on the wafer by supplying resist while rotating the wafer;

measuring a thickness of the resist film formed on the wafer;

obtaining a difference between a measured resist film thickness and the optimum resist film thickness; and correcting the number of rotation of the following wafer during resist application based on the difference.

It is an object of the present invention to provide a method and an apparatus for manufacturing a semiconductor device, with which the thickness of a resist film coated on a semiconductor wafer can be accurately measured in a manufacturing step in an on-line manner, and the yield of semiconductor devices with ultra-micropatterns can be improved.

According to an aspect of the present invention, there is provided a method of manufacturing a semiconductor device comprising: a resist film forming step of coating a resist solution on a chip formation surface of a semiconductor wafer to form a resist film; an exposing step of exposing the resist film; the developing step of developing the resist film; and a thickness measuring step of projecting light on the resist film and detecting reflected light to measure a thickness of the resist film, wherein, in the thickness measuring step, the reflected light from a region of the semiconductor wafer, on which no chip is formed, is detected, and at least one of said resist film forming step, said exposing step, and said developing step, is controlled in accordance with the thickness measured from the detected reflected light.

Since the region on which no semiconductor chip is formed, i.e., a wafer peripheral portion and a scribe-area have a substantially flat surface free from three-dimensional patterns, they uniformly reflect projected light. Thus, the thickness of the resist film formed on the semiconductor wafer can be accurately measured, and a resist coating treatment, an exposing treatment, and a developing treatment can be controlled in accordance with the measured thickness. Thus, the influence of a variation in thickness of the resist film on an electrode's width can be essentially eliminated, and an ultra-micropattern with a desired electrode width can be formed on a wafer.

If the measured thickness is largely offset from a reference value (standard thickness), the resist coating treatment is restarted from the beginning. When the step of forming the resist film is controlled, if the measured thickness exceeds the reference value (standard thickness), the spin speed of a spin coater is increased; otherwise, it is decreased.

When the exposing step is controlled, an optimal exposing amount (exposing energy × exposing time) is determined in advance in accordance with thicknesses. If the thickness measurement result exceeds the reference value (standard thickness), the exposing amount is increased; otherwise, it is decreased.

When the developing step is controlled, an optimal developing time is determined in advance in accordance with thicknesses, if the thickness measurement result exceeds the reference value (standard thickness), the developing time is prolonged; otherwise, it is shortened.

BRIEF DESCRIPTION OF THE DRAWINGS

FIG. 1 shows a layout of a system for manufacturing a semiconductor device;

FIG. 4 is a block diagram showing a coating section and an exposing section for explaining a method of measuring a thickness of a resist film according to a second embodiment of the present invention;

FIG. 5 is a schematic plan view showing a chip and a scribe-area formed on a semiconductor wafer;

FIG. 6 is a block diagram showing a coating section and a developing section for explaining a method of measuring a thickness of a resist film according to a third embodiment of the present invention;

FIG. 7 is a flow chart showing a photolithography step of a semiconductor device;

FIG. 8 shows another layout of a system for manufacturing a semiconductor device;

DETAILED DESCRIPTION OF THE PREFERRED EMBODIMENTS

Figure 2:
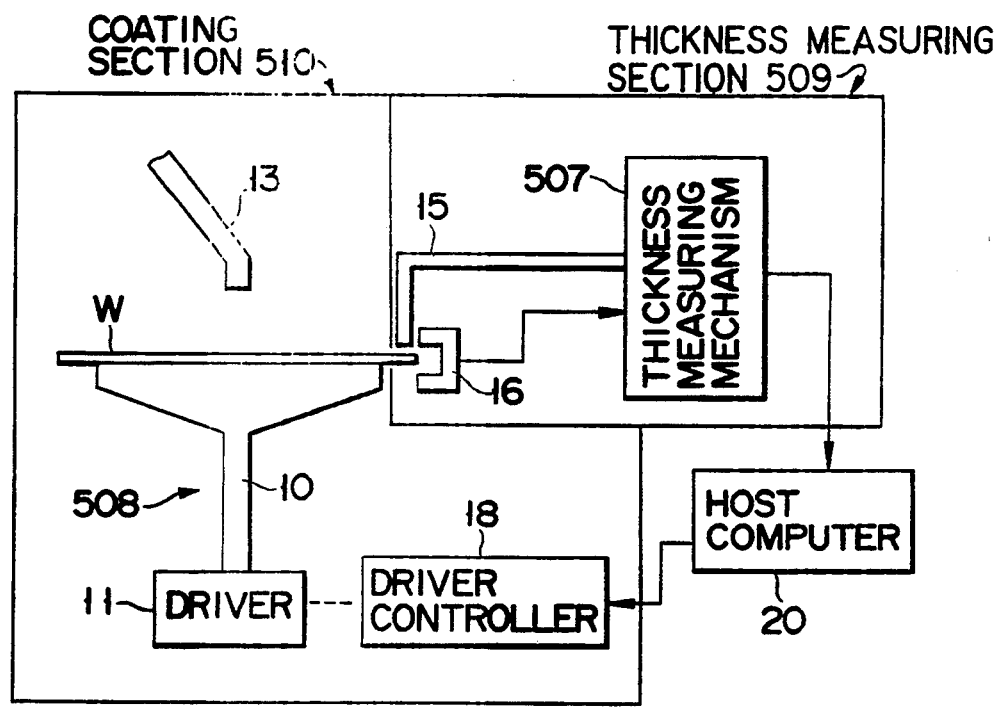
FIG. 2 is a block diagram showing a coating section for explaining a method of measuring a thickness of a resist film according to a first embodiment of the present invention.

Various embodiments of the present invention will now be described with reference to the accompanying drawings.

As shown in FIG. 1, a path 502 extending in a direction of an arrow Y is arranged at a central portion of a base 501 of a spin coater 500. A surface treatment & temperature adjusting section 503, a heating section 505, and a developing section 506 are arrayed on one side, and a thickness measuring section 509 and a resist coating section 510 are arrayed on the other side of the path 502.

A wafer handling device 511 which moves in the Y direction along the path 502 is arranged in the path 502. The handling device 511 has a main body 514 and two wafer chucking/holding tweezers 512 and 513. These tweezers 512 and 513 are arranged vertically, and can be independently operated in the Y direction (lateral direction), an X direction (longitudinal direction), a z direction (vertical direction), and a $\theta$ direction (rotation).

A wafer loading/unloading section 520 is arranged beside the base 501. The wafer loading/unloading section 520 includes wafer cassettes 522 each for storing a semiconductor wafer $W_B$ before a treatment and wafer cassettes 523 each for storing a semiconductor wafer $W_F$ after a treatment. A wafer W can be transferred and received between the tweezers 512 and 513 and tweezers of the loading/unloading section 520 at an interface between the path 502 and the loading/unloading section 520.

A stepper of an exposing section 530 (not shown) is arranged at a side opposite to the loading/unloading section 520 to sandwich the path 502 therebetween. The stepper can transfer/receive the wafer W to/from the tweezers 512 and 513 of the handling device 511 at an interface.

As shown in FIG. 2, the thickness measuring section 509 is provided with first thickness measuring mechanism 507 and the coating section 510 is provided resist coating mechanism (or spin coater) 508. One sheet of semiconductor wafer W is placed on a table 10 of the spin coater 508. A resist solution supply nozzle 13 opposes the semiconductor wafer W. The nozzle 13 communicates with a resist solution supply source (not shown) comprising an adjusting section for adjusting a solution-temperature and atmosphere. The table 10 has a rotary driver 11. A resist solution supplied from the nozzle 13 onto the wafer W can be uniformly dispersed by the rotation force of the table 10 by the driver 11.

The thickness measuring section 509 is arranged adjacent to the coating section 510. A photosensor 15 of first thickness measuring mechanism 507 is arranged to oppose the peripheral portion of the semiconductor wafer W. The photosensor 15 is connected to an input unit of first thickness measuring mechanism 507 through an optical fiber.

Figure 3:
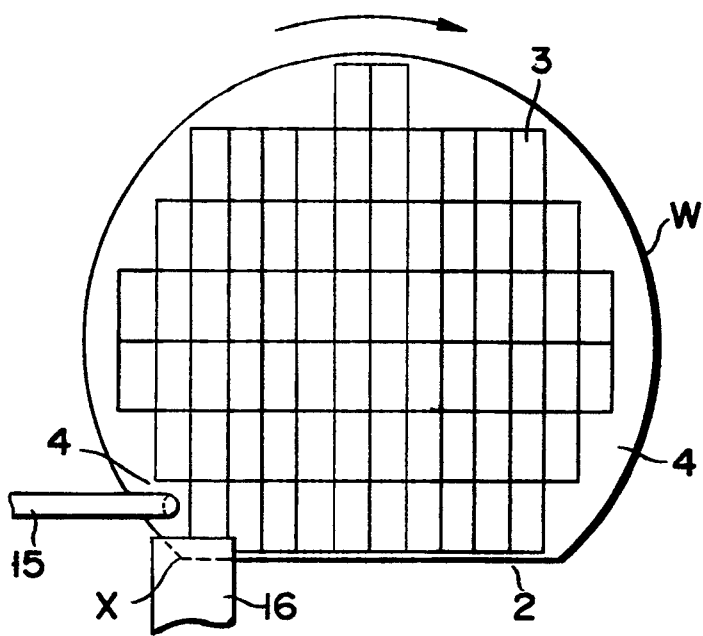
FIG. 3 is a schematic plan view of a semiconductor wafer upon measurement of a thickness.

As shown in FIG. 3, light is projected from the sensor 15 toward a margin region 4 of the semiconductor wafer W, on which no chip 3 is formed. The projected light preferably has a wavelength not to expose the resist film on the wafer w, e.g., a wavelength of 560 nm or more obtained through a filter. A beam spot size is about 2 mm. The sensor 15 has a light-receiving element. The light-receiving element receives only a light component of light reflected by the wafer W, which has a predetermined wavelength selected by the filter. First thickness measuring mechanism 507 converts the light signal into an electrical signal, and then converts the electrical signal into a desired one through an amplifier and an A/D converter.

A position detector 16 is arranged at the same level as the edge of the semiconductor wafer W. When the wafer W is rotated in the $\theta$ direction, the edge portion (point X) of an orientation flat 2 of the wafer w is detected by the position detector 16.

An output unit of first thickness measuring mechanism 507 is connected to an input unit of a host computer 20. The electrical signal converted by first thickness measuring mechanism 507 is input to an arithmetic unit of the computer 20, and the thickness of the resist film is calculated on the basis of the input signal.

An output unit of the host computer 20 is connected to a drive controller 18 of the table driver 11.

The exposing section 530 will be described below with reference to FIG. 4.

The exposing section 530 and the thickness measuring section 509 are connected to each other through the host computer 20. More specifically, information associated with the thickness of the wafer W obtained by first thickness measuring mechanism 507 of the thickness measuring section 509 is input, as reference data, to a control unit 36 of the exposing section 530 through the host computer 20.

The stepper 30 has a wafer table 33 which can chuck the semiconductor wafer W and is movable in the X and Y directions. Optical systems 34 are arranged above the wafer table 33 through a reticle mask in units of chips. These optical systems 34 are connected to the control unit 36.

The optical systems 34 comprise an alignment mechanism 35. The alignment mechanism 35 has a laser light source, a TV camera for detecting reflected light, and an image processing unit. The alignment mechanism 35 is connected to the wafer table 33 through the control unit 36.

The stepper 30 has second thickness measuring mechanism 37 for measuring the thickness of the resist film of the wafer W on the table 33. Second thickness measuring mechanism 37 has the same arrangement as that of first thickness measuring mechanism 507 in the thickness measuring section 509 described above.

As shown in FIG. 5, when the semiconductor wafer W is aligned to a position for exposing a chip 3 by the alignment mechanism 35, a landing position of beam light 7 from second thickness measuring mechanism 37 is set on a scribe-area 6. More specifically, first thickness measuring mechanism 507 in the thickness measuring section 509 measures the thickness at the margin region (region on which no chip 3 is formed) 4 of the wafer W, while second thickness measuring mechanism 37 of the exposing section 530 measures the thickness at the scribe-area 6 of the wafer W. A variation of thicknesses among chips 3 is taken into consideration since an exposing treatment is performed for each chip 3 in the exposing step.

In this case, an excimer laser which has a wavelength not to expose a resist film, e.g., a wavelength of 560 nm or more and has a beam spot size of 50 to 100 $\mu$m is employed as the beam light 7.

Second thickness measuring mechanism 37 causes some light components reflected by the scribe-area 6 which have a predetermined wavelength and are selected by the filter to become incident on the light-receiving element, and converts the incident light into an electrical signal. The electrical signal is compared with a reference value which is measured and stored in advance by first thickness measuring mechanism 507 of the thickness measuring section 509, and the thickness is determined on the basis of the comparison result.

The reason why the thickness is measured at the position of the scribe-area 6 is that it is difficult to measure a thickness at a region on which the chip 3 is formed since a three-dimensional pattern is formed on the undercoating layer of the wafer W, i.e., wafer surface.

The relationship between exposing amounts (exposing times) and the optimal exposing amount (optimal exposing time) cannot be easily determined due to the presence of a standing wave or the like, and is preferably obtained by experiments or the like.

The developing section 506 will be described below with reference to FIG. 6.

The developing section 506 and the thickness measuring section 509 are connected to each other through the host computer 20. More specifically, the thickness measurement information of the wafer W obtained by second thickness measuring mechanism 507 of the thickness measuring section 509 is input to a control unit 41 of the developing section 506 through the host computer 20.

A developing unit 40 has a wafer table 45 which can chuck the semiconductor wafer W and is movable in the X and Y directions. A driver 44 for the table 45 is connected to the control unit 41.

A developer supply nozzle 43 is arranged above the wafer table 45 to oppose the wafer W. The nozzle 43 communicates with a developer supply source 42. A flow control valve of the developer supply source 42 is connected to the control unit 41, and is opened/closed based on an instruction from the control unit 41. The developer supply source 42 stores a developer having a predetermined component and a rinse solution.

An example will be described below with reference to the flow chart of FIG. 7 wherein the thickness of a resist film of a semiconductor wafer W is measured in a given photolithography process upon manufacture of a semiconductor element with an ultra-micropattern.

(I) The cassette 522 storing a large number of semiconductor wafers W is loaded in the section 520. A large number of chips 3 are formed on the pattern formation surface of each semiconductor wafer W. A wafer W is chucked by the handling device 511 to be picked up from the cassette 522, and is loaded in the section 503. The wafer W is washed in the section 503 (STEP 201).

(II) The semiconductor wafer W is dried by heating (STEP 202), and is then subjected to a surface treatment. As a surface treatment solution, hexamethyldisilazane (HMDS) is used (STEP 203). Furthermore, the wafer W is heated or cooled to be adjusted to a predetermined temperature (STEP 204).

(III) The temperature-adjusted wafer W is unloaded from the section 503, and is loaded in the resist coating mechanism 508 of the section 510. A predetermined amount of resist solution is coated on the wafer W (STEP 205). The resultant wafer is loaded in the heating section 505, and is baked for a predetermined period of time (STEP 206).

(IV) The baked wafer W is loaded in first thickness measuring mechanism 507 of the section 509 to measure the thickness of the margin region 4 (STEP 207). The thickness measurement information in the section 509 is stored in a memory of the host computer 20, and is called as needed. By using the thickness measurement information, optimal control is made in STEPs 205, 208, and 211 to obtain a desired thickness (e.g. standard thickness) of the resist film. For example, in STEP 205, the spin speed of the spin coater 508 is adjusted to increase/decrease the thickness of the resist film. During coating, since the resist solution scatters around, the photosensor 15 and the position detector 16 of first thickness measuring mechanism 507 are withdrawn from a position near the wafer W to prevent attachment of the resist solution. When the measured thickness is largely offset from the reference value (standard thickness), the wafer W is returned to the coating step (STEP 205) to re-coat the resist.

(V) After thickness measurement, the wafer W is loaded in the exposing section 530, and the thickness is measured by second thickness measuring mechanism 37 in units of chips 3. The above-mentioned thickness measurement information is called from the host computer 20 as reference data, and is compared with each thickness measurement result. An exposing time and an exposing energy amount are optimally adjusted on the basis of each comparison result to expose the wafer (STEP 208).

Note that measurement by the thickness measuring mechanism 37 can be executed in, e.g., about 100 ms. Contrary to this, exposure by the optical system 34 normally requires about 200 ms. For this reason, it is preferable that a thickness measuring operation by second thickness measuring mechanism 37 and an exposing operation by the optical system 34 are started at the same time, and control of the exposing time is started when the thickness measurement result is obtained. Thus, both the operations can be simultaneously performed without almost impairing a throughput of the stepper 30. Measurement by the thickness measuring mechanism 37 need not be executed upon every exposure but may be performed several times for a single wafer W. After the wafer which is coated with a resist by the spin coater is baked, it is loaded in the stepper 30, and exposure is executed.

(VI) The wafer W is loaded from the exposing section 530 to the heating section 505, and is baked under a predetermined condition (STEP 209).

The wafer W is loaded in the developing section 506, and a predetermined amount of developer is supplied from the nozzle 43 to the wafer W. Thus, the developer is brought into contact with the resist film for a predetermined period of time to develop it (STEP 210). Thereafter, a rinse solution is supplied to the wafer W, and the wafer W is rotated by the driver 44, thus rinsing and drying the wafer W.

In this case, data associated with correlations between thicknesses of resist films and optimal developing times are acquired in units of types of resist and types of developer, and are prestored in the host computer 20, when the measurement data by first thickness measuring mechanism 507 is input to the computer 20, a corresponding optimal developing time is retrieved, and is sent to the developing unit 40 as an instruction signal. Thus, the developing time can be optimally controlled.

(VII) After development, the wafer W is baked under a predetermined condition (STEP 211). The wafer W is then conveyed to an etching apparatus (not shown), and is etched (STEP 212).

According to this embodiment, in both the thickness measuring section 509 and the exposing section 530, the thickness of the resist film of the wafer W as a product is measured at flat regions, and treatments in the coating step (STEP 205), the exposing step (STEP 208), and the developing step (STEP 210) can be controlled to optimal conditions in accordance with these measurement data. Therefore, the thickness of the resist film of a wafer w as a product can be more accurately measured than a conventional method, i.e., a method of measuring a thickness of a resist film on a dummy wafer as reference data. For this reason, semiconductor devices having ultra-micropatterns of predetermined line widths can be manufactured with high yield without adversely influencing the pattern line width of the resist pattern.

Figure 9:
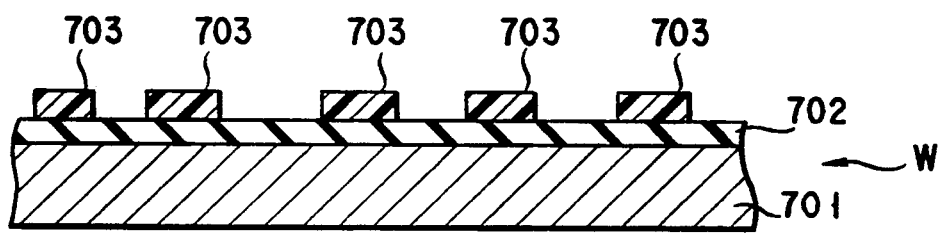
FIG. 9 is a longitudinal section of a silicon wafer.

The following is an explanation of the initial stage of the pattern formation step for a semiconductor device having a multi-layered structure with reference to FIG. 9. A semiconductor device having a multi-layered structure is formed by depositing a plurality of layers on a bare silicon wafer. In the pattern formation step, an underlying layer 702 including layers of $SiO_2$, poly-Si, SiN, BPSG (boron phosphorous silicon glass), P-doped Si, etc. is formed over the surface of the base material 701 of a bare silicon wafer such as to have a uniform thickness. For example, the $SiO_2$ layer can be obtained by subjecting a silicon wafer to a heat-oxidation process. A resist layer 703 is formed on the underlying layer 702 by applying photoresist liquid thereon. Next, the resist layer 703 is exposed to light, baked, developed, to form a predetermined pattern. Thereafter, the underlying layer 702 is etched to remove some parts to create an element separation region, etc. The underlying layer 702 must be prepared precisely in terms of thickness, because if the thickness thereof is not exactly as designed, measurement of the thickness of the resist layer 703 applied thereon will be erroneous.

The principle of measurement of a film thickness will be summarized. The thickness of each of the layers 702 and 703 on the wafer is measured by the multiple interference method. According to the multiple interference method, a sensor unit is positioned to face a wafer. A light beam having a predetermined wavelength is irradiated onto the surface of the wafer from the light-emitting element of the unit, and the reflected light beam is received by the light-receiving element. The reflected light beam has two types, one being the surface reflection light reflected from the surface of the layer 702, and the other being the bottom reflection light reflected from the bottom thereof. The light intensity, which may vary from a particular wavelength to another due to interference between the surface reflection wave and the bottom reflection wave, is detected, and an appropriate thickness is determined based on this light intensity.

U.S. Pat. No. 4,738,910 discusses a technique based on the relationship between the thickness of a resist film and the developed pattern of a resist (resist development measurement). More specifically, in a size-reduction projection exposure apparatus for using light beams having a single wavelength, the development size varies with the increase in film thickness in a sinusoidal manner, due to the interference of the light beams with each other. To solve this problem, a target is set at a peak value (where the slope of the tangent line thereto is zero) of the sine curve, and thus the dispersion in size of developments can be minimized. That is, there is a certain range for the optimal resist thickness, in which the inconsistency of the resist development measurement values is narrowed. In order to obtain good measurement values, the target thickness of the resist film to be applied is set at the middle point of the resist film thickness range, within which a resist film thickness is accepted as being allowable. This resist thickness range is used as an allowable resist thickness error range.

Next, the pattern formation step, which is conducted at the initial stage of the procedure of manufacturing a semiconductor device having a multi-layered structure, will be explained with reference to FIGS. 10 and 11.

Figure 10:
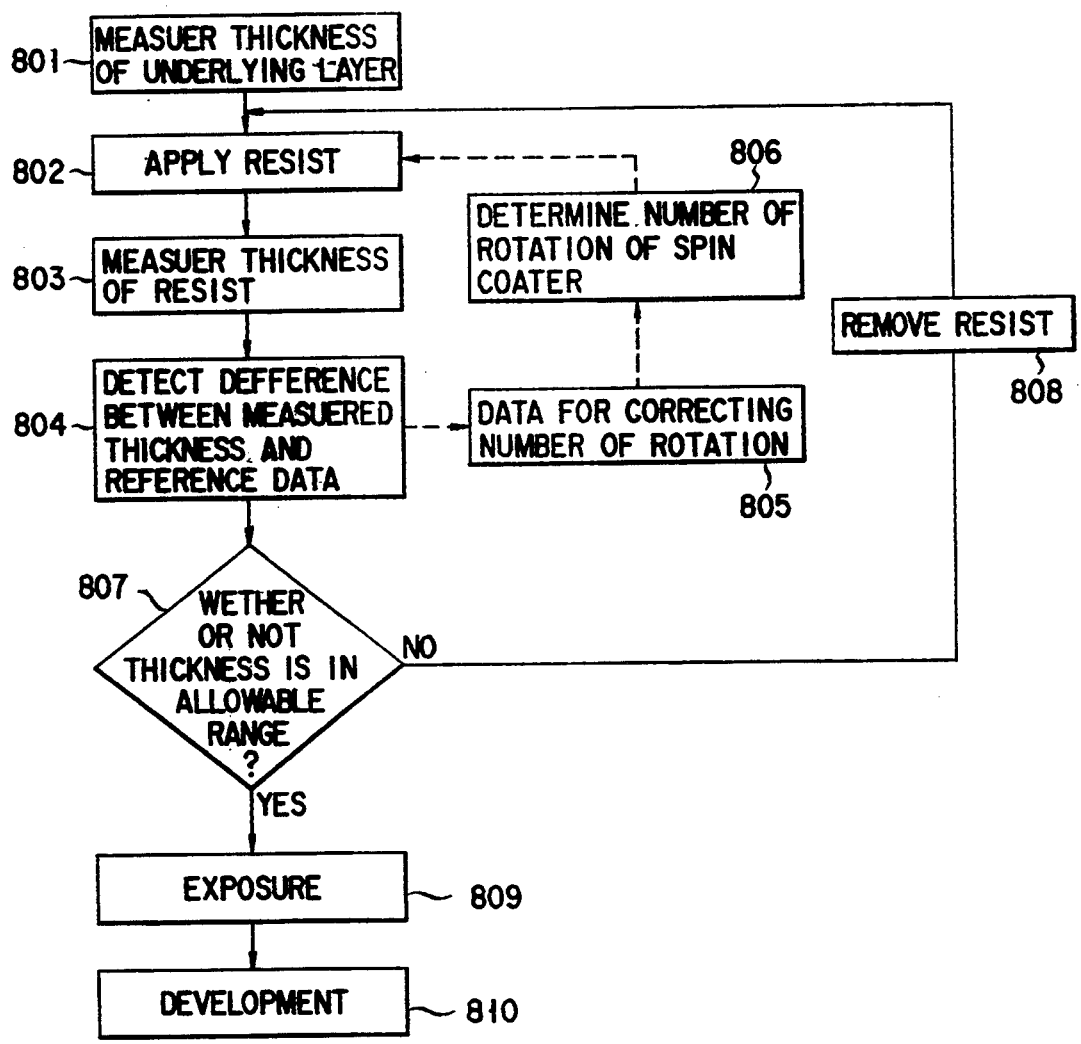
FIG. 10 is a flow chart showing another embodiment.
Figure 11:
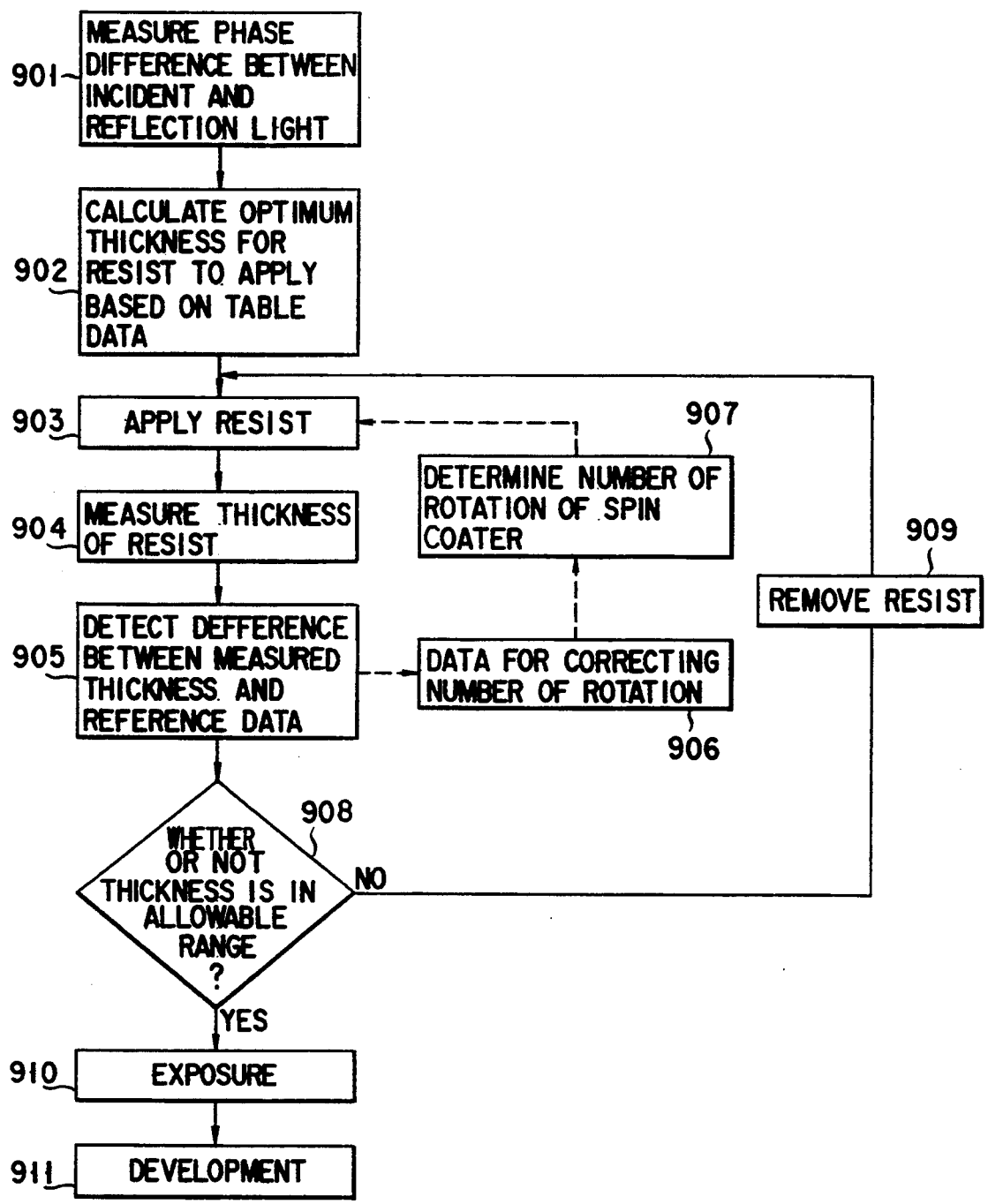
FIG. 11 is a flow chart showing a further embodiment.

FIG. 10 is a flow chart showing a series of steps for applying a resist layer 703 such as to have a constant target thickness. Table data of an optimum resist film thickness determined for each underlying layer thickness (the first reference data), table data for providing a resist thickness corresponding to the wafer (spin coater) rotation number (the second reference data), data for target resist thickness range (the third reference data), and data for the allowable resist thickness error range (the fourth reference data) are all stored in the host computer 20 in advance.

The thickness of the underlying layer 702 formed on a silicon wafer W in the CVD (chemical vapor deposition) process section is measured (step 801), and the data of the measured underlying layer thickness is stored in the memory.

As shown in FIG. 2, silicon wafer W is conveyed into the coating section 510, where the wafer is subjected to washing, drying, and an adhesion treatment. Then, wafer W is heated or cooled to control the temperature of the surface thereof so as to have a predetermined temperature.

The wafer (spin coater) rotational speed is obtained based on the second reference data and the predetermined application film thickness (the third reference data), and the spin coater is rotated at this rotation number to apply a resist on the underlying layer 702 (step 802). The thickness of the resist film applied is measured on the basis of the thickness measurement data of the underlying layer, and the first reference data (step 803). Thus, the resist film thickness can be measured accurately regardless of the thickness of the underlying layer 702. The data of the thickness of the applied resist layer is stored in memory.

The difference between the application resist thickness measurement data and the third reference data is detected (step 804). The "difference" here means a deviation from the target value for the application resist film thickness. Further, correction data for the wafer (spin coater) rotation number is calculated based on the difference data and the second reference data (step 805). This correction data is stored in the memory as the fifth reference data.

In accordance with the fifth reference data, a new spin coater rotation number for applying a resist is set, and the new rotation number is fed back so that the resist film applied on the next silicon wafer has a predetermined thickness (step 806). Then, the difference data obtained in step 804 is compared with the fourth reference data so as to judge whether the resist film thickness error is within the allowable range (step 807).

In the case where the difference data is out of the allowable range (NO in step 807), the resist applied is removed from the silicon wafer W for rework (step 808). The silicon wafer is returned to stop 802, and subjected to the same procedure again up to step 808 to reapply a resist.

In the case where the difference data is within the allowable range (YES in step 807), the application resist 703 is exposed in the exposure section 530 (step 809). Further, the resist is baked, and developed (step 810).

In the above embodiment, the following advantages can be obtained. The resist application conditions are always updated by feeding back the actual data for the resist thickness of a preceding wafer to the resist application step 802 for the following wafer; therefore the thickness of the resist layer 703 applied on the following wafer will be accurate. Moreover, the resist layer 703 can be formed at a high accuracy regardless of thickness of the underlying layer 702.

Further, the applied resist judged to be NO (not allowable) in terms of the film thickness error range can be removed from the wafer while it is on-line, and a new resist can be reapplied. Therefore, the throughput and yield can be improved.

Another embodiment will now be explained with reference to FIG. 11. An explanation of the part of the procedure common to this embodiment and the previous one, will be omitted here. In this embodiment, table data (the six reference data) for the relationship between a phase difference between light beams each having an exposure wavelength, and a resist thickness is used in place of the first reference data, for correction of the resist application.

The "phase difference between light beams each having an exposure wavelength" can be defined as a phase difference of the standing wave due to interference between incident and reflection light beams on/from the resist layer 703 formed on the underlying layer 702 having a variable thickness while being exposed to light. This phase difference varies in accordance with the refractive index or thickness of the resist layer 703. Meanwhile, when underlying layers 702 differ from each other in thickness, the optimal resist thickness, with which the resist development sizes are less dispersed, is shifted. Therefore, it is necessary to measure the phase difference of the standing wave for the thickness of each underlying layer 702, and store comparison table data for the optimum thickness of a resist to be applied in advance.

Since there is a constant relationship between a resist application film thickness and a wafer (spin coater) rotation number, the wafer (spin coater) rotation number for obtaining the optimum resist thickness can be determined based on the detection results of the phase difference of the standing wave.

The following is an explanation of a case where the thickness is corrected while actually forming a resist layer on an underlying layer. First, contrast table data containing the relationship between a critical dimension of a chip pattern after development and an optimum resist film thickness is obtained and stored in memory, and the second and sixth reference data are stored in the memory of the host computer 20 in advance.

A light beam having an exposure wavelength is irradiated on the underlying layer 702 of the wafer so as to detect and measure the phase difference of the standing wave created due to interference between the incident light and the reflection light (step 901). Based on the phase difference measurement data and the sixth reference data, data for the target thickness of a resist applied on an underlying 702 (the seventh reference data) is obtained, and stored in memory. Further, data for an allowable resist thickness error-range (the eighth reference data) is obtained in accordance with the seventh reference data, and stored in the memory (step 902).

The wafer (spin coater) rotation number is obtained based on the second reference data and the seventh reference data, and the spin coater is rotated at this rotation number to apply a resist on the underlying layer 702 (step 903).

The thickness of the resist film applied is measured by irradiating a light beam having an exposure wavelength on the applied resist(step 904), and the measured thickness data for the applied resist is stored in the memory.

The difference between the application resist thickness measurement data and the seventh reference data is detected (step 905).

Further, correction data for the wafer (spin coater) rotation number is calculated based on the difference data and the second reference data (step 906). This correction data is stored in the memory as the ninth reference data.

In accordance with the ninth reference data, a new spin coater rotation number for applying a resist is set, and the new rotation number is fed back so that the resist film applied on the next silicon wafer has a predetermined thickness (step 907). Then, the difference data obtained in step 905 is compared with the eighth reference data so as to judge whether the resist thickness error is within the allowable range (step 908).

In the case where the difference data is out of the allowable range (judged NO in step 908), the resist applied is removed from the silicon wafer W for rework (step 909). The silicon wafer is returned to step 903, and subjected to the same procedure again up to step 908 to reapply a resist on the silicon wafer W.

In the case where the difference data is within the allowable range (judged YES in step 908), the application resist 703 is exposed in the exposure section 530 (step 910). Further, the resist (wafer) is baked, and developed (step 911).

As described above in connection with this embodiment, even when underlying layers 702 differ from each other in thickness, the target thickness is always updated in accordance with the thickness of each underlying layer. Therefore, a resist layer 703 having its optimum thickness can be formed on an underlying layer 702. In other words, even in the case where the thickness of an underlying layer 702 deviates from the target value, the thickness of the resist layer 703 can be made optimum for the thickness of the actual underlying 702.

In the above embodiment, the path 502 for conveying the wafer W is laid out at the central portion. However, the present invention is not limited to this. For example, as shown in FIG. 8, the present invention may be applied to an in-line type apparatus. In the in-line type apparatus, thickness measuring mechanisms 507 are arranged before and after a resist coating mechanism 508, so that mechanisms between a sender 601 and a receiver 602 are sequentially laid out.

According to the in-line type apparatus, thickness measurement results obtained before and after coating are compared, so that a resist film in the coating step can be accurately formed.

As described above, according to the manufacturing method of the present invention, the thickness of a resist film coated on a wafer as a product is measured in an on-line manner, and treatment steps in photo-lithography can be controlled in accordance with the measured thickness. Therefore, the manufacturing yield of semiconductor devices can be greatly improved. Especially, in the exposing step, the thickness of a resist film is measured in units of chips, and corresponding exposing amounts are controlled. Even if the thicknesses of chips vary, a width of electrode can fall within a predetermined range. Thus, productivity of a semiconductor device with an ultra-micropattern electrode can be improved.

What is claimed is:

1. A method for controlling a thickness of a resist film formed on a semiconductor wafer having an underlying layer previously formed thereon, said method comprising the steps of:

measuring a thickness of said underlying layer formed on the wafer;

storing the underlying layer thickness measurement data into memory means;

storing first data of an optimum resist film thickness determined for the underlying layer thickness, second data for providing a resist film thickness corresponding to a wafer rotation number, third data for a target resist film thickness, and fourth data for an allowable resist film thickness range into the memory means before said underlying layer thickness measuring step;

obtaining a wafer rotation number based on the second data and the third reference data;

rotating the wafer at the obtained rotation number and applying a resist on the underlying layer;

obtaining a thickness of the resist film applied on the underlying layer, based on said underlying layer thickness measurement data and said first data;

storing the thickness film measurement data of the resist film into the memory means;

detecting a difference between the resist film thickness measurement data and said third data;

calculating a correction value for the wafer rotation number, based on the detected difference and said second data;

storing the correction value of the wafer rotation number into the memory means as fifth data;

correcting the wafer rotation number during application of the resist to the wafer, based on the fifth data, and feedback-controlling the wafer rotation number so that a second wafer following said wafer has said target resist thickness.

2. A method according to claim 1, wherein said underlying layer comprises one of $SiO_2$, poly-Si, SiN and boron phosphorus silicon glass, formed by chemical vapor deposition.

3. A method according to claim 1, wherein said underlying layer comprises $SiO_2$ formed by thermal oxidation.

4. A method for controlling a thickness of a resist film formed on a semiconductor wafer having an underlying layer previously formed thereon, said method comprising the steps of:

obtaining contrast data indicating a correlation between an optimum resist film thickness and a critical dimension of a chip pattern on said wafer after development;

storing the contrast data into memory means;

measuring a phase difference of a standing wave generated due to interference between an incident light beam and a reflected light beam by irradiating light having an exposure wavelength on said underlying layer on said wafer;

calculating an optimum thickness of a resist film on the basis of the phase difference;

obtaining a number of rotation of a wafer based on the calculated optimum thickness of the resist film;

forming a resist film on the wafer by supplying resist while rotating the wafer;

measuring a thickness of the resist film formed on the wafer;

obtaining a difference between a measured resist film thickness and the optimum resist film thickness; and correcting the number of rotation of a second wafer following said wafer during resist application based on the difference.

5. A method according to claim 4, wherein said underlying layer comprises one of $SiO_2$, poly-Si, SiN and boron phosphorus silicon glass, formed by chemical vapor deposition.

6. A method according to claim 4, wherein said underlying layer comprises $SiO_2$ formed by thermal oxidation.

* * * * *